United States Patent [19]

McCormick, II

[11] Patent Number: 4,932,074

[45] Date of Patent: Jun. 5, 1990

[54] RAPID SCANNING RADIO WITH MULTI-MODE LOCAL OSCILLATOR CONTROL

[75] Inventor: Ben F. McCormick, II, Noblesville, Ind.

[73] Assignee: Uniden America Corporation, Ft. Worth, Tex.

[21] Appl. No.: 176,628

[22] Filed: Apr. 1, 1988

[51] Int. Cl.[5] .............................................. H04B 1/16
[52] U.S. Cl. .................................. 455/167; 455/165; 455/164; 455/183
[58] Field of Search ............... 455/161, 164, 165, 166, 455/167, 175, 183

[56] References Cited

U.S. PATENT DOCUMENTS

| | | | |
|---|---|---|---|
| 4,236,251 | 11/1980 | Ohgishi et al. | 455/180 |
| 4,264,977 | 4/1981 | Deiss | 455/182 |
| 4,367,558 | 1/1983 | Gercekci et al. | 455/165 |
| 4,461,036 | 7/1984 | Williamson et al. | 455/165 |
| 4,498,191 | 2/1985 | Rogers | 455/164 |
| 4,509,203 | 4/1985 | Yamada | 455/166 |
| 4,521,915 | 6/1985 | Baker et al. | 455/165 |

Primary Examiner—Robert L. Griffin
Assistant Examiner—Ralph Smith
Attorney, Agent, or Firm—Woodard, Emhardt, Naughton, Moriarty & McNett

[57] ABSTRACT

A rapid scanning radio with multi-mode local oscillator control. In one embodiment a phase-locked loop is closed for tuning to all frequencies of interest, and each time the loop locks a DAC is loaded with successive digital values until a value corresponding to the steady-state VCO tuning voltage is found for the currently tuned channel. That digital value is stored for later recall as the tuning value for that channel. Once digital values are determined for all the tunable frequencies in the radio, the loop is opened for high-speed scanning under open-loop control of the DAC.

1 Claim, 3 Drawing Sheets

RAPID SCANNING RADIO WITH MULTI-MODE LOCAL OSCILLATOR CONTROL

BACKGROUND OF THE INVENTION

This invention relates to scanning radios.

A common problem with scanning radio equipment, particularly equipment employing indirect frequency synthesis techniques, is limited scanning speed, a consequence of which is the inability in many situations to adequately monitor a large number of channels of interest. Attempts have been made to avoid the problem, for example, by establishing priority channels which are monitored more frequently than other channels. Numerous attempts have been made to overcome the problem by increasing scanning speed, involving techniques such as adjustable time constants, coarse and fine tuning, and multiple phase-locked loops. Nevertheless, there remains a need for a relatively simple, reliable, rapid scanning radio system.

SUMMARY OF THE INVENTION

The present invention provides a rapid scanning radio with multi-mode local oscillator control, and includes an electrically variable local oscillator having a frequency control input, a reference oscillator, synthesizer means for comparing an output signal from the local oscillator with an output signal from the reference oscillator, means for filtering an output signal from the synthesizer means, a DAC, and switch means for coupling the local oscillator frequency control input to the filter means in a closed-loop mode and to said DAC in an open-loop mode. The invention further includes a first scan means operative during closed-loop mode for sequentially supplying a plurality of frequency codes to a frequency code input of the synthesizer means, the scan means supplying each frequency code for a sufficient duration for the signal on the oscillator frequency control input to reach a steady state, processor means operative during closed-loop mode, for each frequency code supplied to said synthesizer means, for determining a DAC input value which corresponds to the steady-state level of the signal on the oscillator frequency control input, and a second scan means operative during open-loop mode for sequentially loading the DAC with the DAC input values identified by the processor means.

DESCRIPTION OF THE PREFERRED EMBODIMENTS

Figure 1:
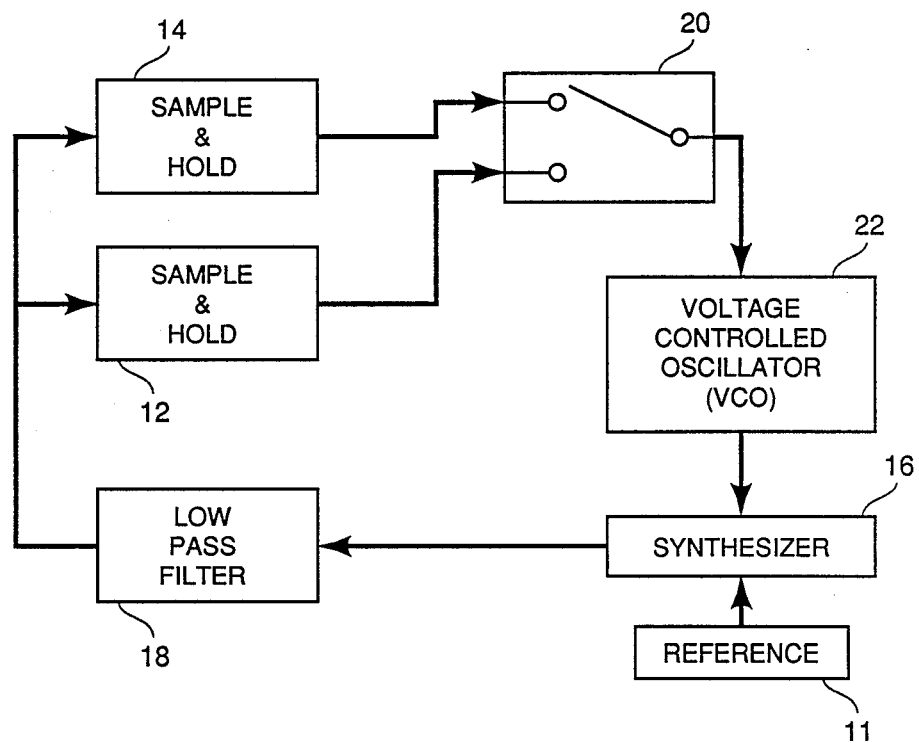
FIG. 1 is a block diagram of a first embodiment of the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring now to FIG. 1, there is shown one embodiment of the present invention in which a reference oscillator 11 supplies a stable reference frequency signal to frequency synthesizer 16, which is connected in a feedback loop with a lowpass filter 18, a sample-and-hold 12, a sample-and-hold 14, an analog switch 20, and a voltage controlled oscillator (VCO) 22. Synthesizer 16 produces an error signal supplied to the input of lowpass filter 18. Inputs of sample-and-hold 12 and sample-and-hold 14 are connected to the output of lowpass filter 18. The outputs from sample-and-holds 12 and 14 are supplied to inputs of analog switch 20. The output of analog switch 20 drives a VCO 22 and VCO 22 provides frequency feedback information to synthesizer 16.

Normal scanning operation of a scanning radio receiver would occur with the sample-and-holds 12 and 14 in the mirror state, i.e., where their output mirrors the signal applied to their input. Once squelch of the receiver is opened and scanning stops as a result of detection of an active channel, the circuit in FIG. 1 is employed to decrease the dead time resulting when the receiver switches to a priority frequency. The delays associated with the programming of a synthesizer 16 and the subsequent delay wherein synthesizer 16 stabilizes VCO 22 to a particular frequency are significantly diminished by the circuit in FIG. 1.

While the receiver is tuned to an active channel, the processor will at predetermined time intervals tune to the priority frequency and check squelch. By programming synthesizer 16 to a priority frequency and storing in advance an error signal in S/H 12, tuning delays are significantly decreased for tuning the priority channel.

A digital processor controlled receiver places both sample-and-holds 12 and 14 into the mirror state, where their outputs mirror their inputs. Frequency scanning occurs at the request of the processor, which supplies the necessary frequency codes to synthesizer 16. Successive codes are supplied to the synthesizer until an open squelch condition is sensed by the processor. A number of forms of squelch circuits would be appropriate for use in conjunction with the present invention, and several suitable forms are disclosed in U.S. patent application Ser. No. 21,008 filed Mar. 2, 1987, which application is hereby incorporated by reference. Once an active channel has been tuned and a predetermined interval of time has expired, the processor saves the error voltage signal controlling VCO 22 by placing sample and hold 14 in the hold state. Analog switch 20 is then switched to the down position and sample-and-hold 12 will force VCO 22 to the priority channel frequency. A squelch open test is then executed by the processor. If squelch is open, the processor leaves analog switch 20 in the down position. If squelch is not open, analog switch 20 is returned to the up position. The squelch check occurs in approximately 2 milliseconds.

Figure 2:
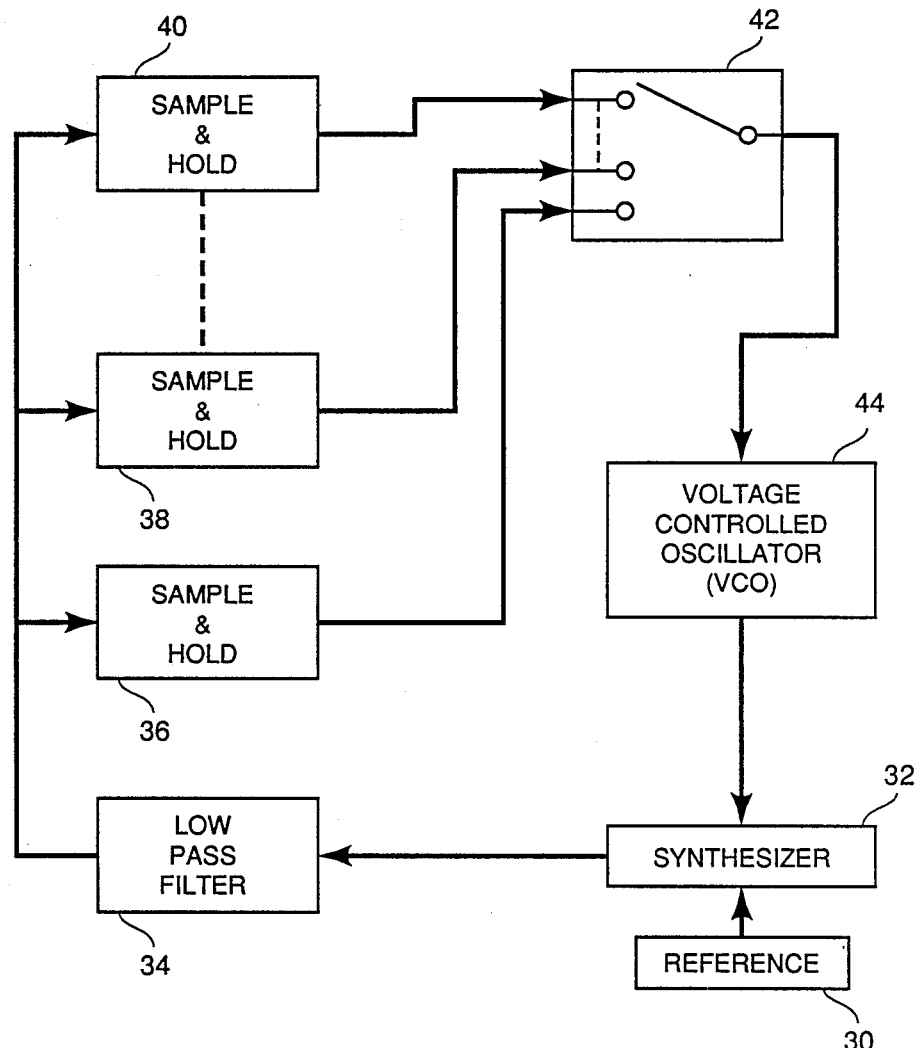
FIG. 2 is a block diagram of a second embodiment of the present invention.

A second embodiment of the present invention is disclosed in FIG. 2. Referring now to FIG. 2, reference oscillator 30 supplies a reference frequency to synthesizer 32. Synthesizer 32 has in its feedback loop lowpass filter 34, sample-and-hold 36, sample-and-hold 38, sample-and-hold 40, an analog switch 42, and voltage controlled oscillator 44. Lowpass filter 34 is supplied with the error signal produced by synthesizer 32. Sample and hold 36 38 and 40 are supplied at their input with the output of lowpass filter 34 and the output of each sample-and-hold 36, 38, and 40 is supplied to the various inputs of an analog switch 42. The output of analog switch 42 is connected to the feedback input of a voltage controlled oscillator and a synthesizer 32 monitors the frequency of VCO 44 to produce error voltage signal that is supplied to the input of lowpass filter 34.

Initially synthesizer 32 is programmed with a code calling for a particular frequency, thereby producing an error voltage at the input of lowpass filter 34. Sample and hold 36, 38 and 40 are all placed in the mirror state. With analog switch 42 in the uppermost position, synthesizer 32 upon receiving a frequency code will produce an error voltage, said error voltage being filtered by lowpass filter 34 and supplied to the input of sample-and-hold 40, the feedback loop being closed by the analog switch 42 in the uppermost position. VCO 44 will then respond by adjusting its frequency upwards or downwards based upon the error voltage supplied from analog switch 42. Once the lock state has occurred, in other words the error voltage has stabilized and the VCO 44 is tuned to the frequency desired by the code input to synthesizer 32, sample-and-hold 40 is placed in the hold state. The DC voltage then appearing at the output of sample-and-hold 40 is that required by VCO 44 to oscillate at the frequency desired when frequency code 1 was input to synthesizer 32. The same process is employed with sample-and-hold 38 and sample-and-hold 36 to produce a second and a third DC Voltage at the output of sample and hold 38 and 36 respectively, to tune VCO 44 to a second and third frequency with analog switch 42 being in the middle state and the down state for frequency 2 and frequency 3, respectively. Once sample-and-hold 36, 38, and 40 are all three holding a DC voltage at their outputs, the switching time from the top to the middle to the down position of analog switch 42 will be dramatically faster than the typical settling time of the synthesizer and feedback loop necessary to set up a particular frequency.

Figure 3:
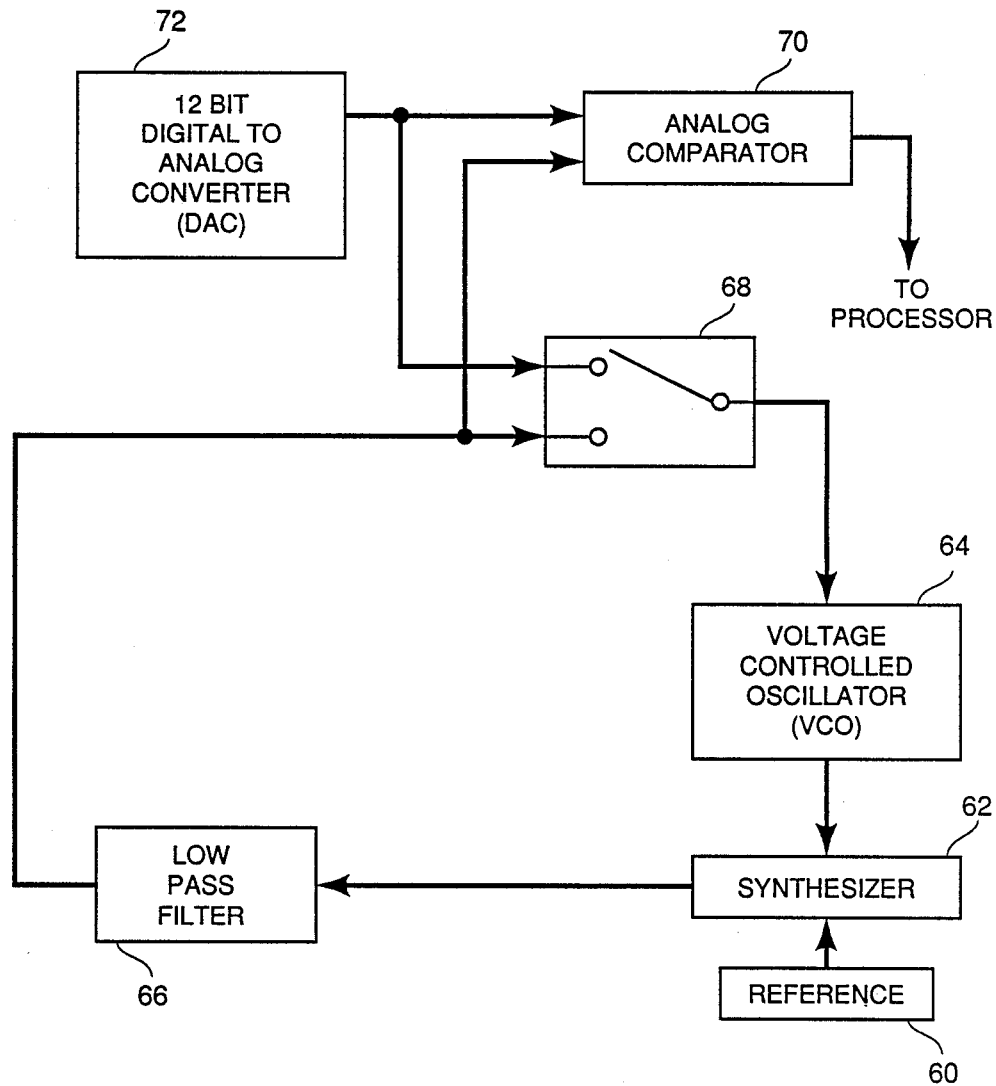
FIG. 3 is a block diagram of a third embodiment of the present invention.

FIG. 3 depicts another embodiment of the present invention. Referring now to FIG. 3, reference oscillator 60 supplies a reference frequency to synthesizer 62. Synthesizer 62 is a digitally programmable frequency synthesizer. The error signal produced by synthesizer 62 is supplied to the input of a lowpass filter 66. The output of lowpass filter 66 is connected to an input of analog switch 68 and to an input of analog comparator 70. The other input of analog switch 68 is connected to the output of a twelve-bit digital-to-analog converter (DAC) 72. The output of DAC 72 is also connected to a second input of analog comparator 70. The output of analog comparator 70 is monitored by a processor. DAC 72 is also controlled by the processor. Synthesizer 62 receives its programming code from the processor and analog switch 68 is controlled by the processor. The processor may be a single chip microprocessor with built-in parallel I/0.

With reference to FIG. 3, two operational modes will be described. The first mode of operation may be described as a learn mode, in which the processor learns the DAC input values for all frequencies tunable by the scanning receiver. The processor places analog switch 68 in the down position, thereby closing the loop, and programs synthesizer 62 for the first frequency. The synthesizer 62, lowpass filter 66, analog switch 68, and voltage controlled oscillator 64 will settle within approximately 25 milliseconds in a steady-state condition on the frequency requested. Once the loop locks, the processor begins a comparing process in which DAC 72 is programmed with a bit pattern to produce a voltage and the processor will monitor the output of analog comparator 70, from which it determines the necessary digital input value to DAC 72 in order to mirror the voltage at the output of lowpass filter 66, i.e., the VCO tuning voltage. The processor loads DAC 72 successively until it determines the bit pattern needed for DAC 72 to cause analog comparator 70 to change state. Once the bit pattern necessary for recreating the steady-state error voltage is determined, that bit pattern is stored in memory and referenced as the voltage required to program VCO 64 to obtain the frequency desired.

This process is repeated for each frequency to which the scanning receiver may tune. Once all frequencies have been tuned by the synthesizer and a bit pattern for DAC 72 has been determined for each frequency, analog switch 68 is placed in the up position, opening the loop, and tuning is then performed simply by programming DAC 72 with one of the digital values determined in closed-loop mode. The setup time for the output of DAC 72 is significantly shorter than the settling time for the PLL, so the VCO 64 is tuned to the desired frequency much more rapidly.

It will be understood by those skilled in the art that the teachings of the present invention are applicable to transmitters as well as to receivers.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

I claim:

1. A rapid scanning radio circuit with multi-mode local oscillator control, comprising:

an electrically variable local oscillator having a frequency control input; a reference oscillator;

synthesizer means for comparing an output signal from said local oscillator with an output signal from said reference oscillator, said synthesizer means including a frequency code input;

filter means for filtering an output signal from said synthesizer means;

a DAC;

switch means for coupling said local oscillator frequency control input to said filter means in a closed-loop mode and to said DAC in an open-loop mode;

first scan means operative during said closed-loop mode for sequentially supplying a plurality of frequency codes to said frequency code input of said synthesizer means, said scan means supplying each frequency code for a sufficient duration for the signal on said oscillator frequency control input to reach a steady state;

processor means operative during said closed-loop mode for determining a DAC input value which corresponds to the steady-state level of the signal on said oscillator frequency control input; and second scan means operative during said open-loop mode for sequentially loading said DAC with said DAC input values identified by said processor means.

* * * * *